United States Patent
Leibowitz et al.

(10) Patent No.: US 8,300,417 B2
(45) Date of Patent: Oct. 30, 2012

(54) APPARATUS FOR ADAPTING MEZZANINE CARDS

(75) Inventors: Mark E. Leibowitz, Ronkonkoma, NY (US); James Limardo, Smithtown, NY (US); William F. Aversano, East Northport, NY (US); Michael Borthwick, Brooklyn, NY (US); Elliot Samuel, Huntington, NY (US); Saeed Karamooz, Henderson, NV (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 264 days.

(21) Appl. No.: 12/528,462

(22) PCT Filed: Dec. 8, 2008

(86) PCT No.: PCT/US2008/013503
§ 371 (c)(1), (2), (4) Date: Aug. 25, 2009

(87) PCT Pub. No.: WO2009/075819
PCT Pub. Date: Jun. 18, 2009

(65) Prior Publication Data
US 2010/0039783 A1 Feb. 18, 2010

Related U.S. Application Data

(60) Provisional application No. 61/007,312, filed on Dec. 11, 2007.

(51) Int. Cl.
*H05K 5/00* (2006.01)
(52) U.S. Cl. ......... 361/756; 361/753; 361/752; 361/748
(58) Field of Classification Search .................. 361/756, 361/753, 752, 74, 8
See application file for complete search history.

(56) References Cited

U.S. PATENT DOCUMENTS

| | | | | |
|---|---|---|---|---|
| 5,696,668 A * | 12/1997 | Zenitani et al. | ............... | 361/802 |
| 5,909,359 A * | 6/1999 | Summers et al. | ............. | 361/748 |
| 6,309,237 B1 * | 10/2001 | Longueville | .................. | 439/267 |
| 6,935,868 B1 * | 8/2005 | Campini et al. | ................ | 439/67 |
| 2002/0006026 A1 * | 1/2002 | Takahashi et al. | ............ | 361/687 |
| 2006/0198098 A1 * | 9/2006 | Clark et al. | ..................... | 361/686 |
| 2007/0127225 A1 * | 6/2007 | Slaton | .......................... | 361/807 |
| 2007/0242423 A1 * | 10/2007 | Joist et al. | ..................... | 361/683 |
| 2008/0043448 A1 * | 2/2008 | Finnerty et al. | ............... | 361/748 |
| 2009/0186494 A1 * | 7/2009 | Bell et al. | ........................ | 439/65 |

* cited by examiner

*Primary Examiner* — Tuan T Dinh
*Assistant Examiner* — Steven Sawyer
(74) *Attorney, Agent, or Firm* — Dilworth & Barrese, LLP; Michael J. Musella; Daniel J. Long

(57) ABSTRACT

There is provided an apparatus for accommodating at least two different sized cards, the apparatus comprising a card housing comprising one or more card slots, each card slot being adaptable for inserting the at least two different sized cards; and a card guide system for adapting said one or more card slots for insertion of at least one of the at least two different sized cards. There is also provided a modified mezzanine card having at least one increased non-standard physical dimension relative to a standard mezzanine card suitable for insertion in the apparatus using the card guide system.

17 Claims, 6 Drawing Sheets

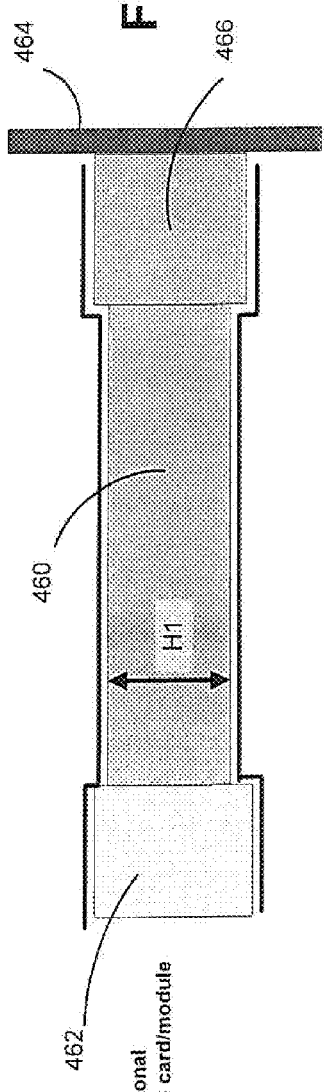
FIG. 4a
Conventional
Single Width AMC card/module
306
AMC+ card/module
310
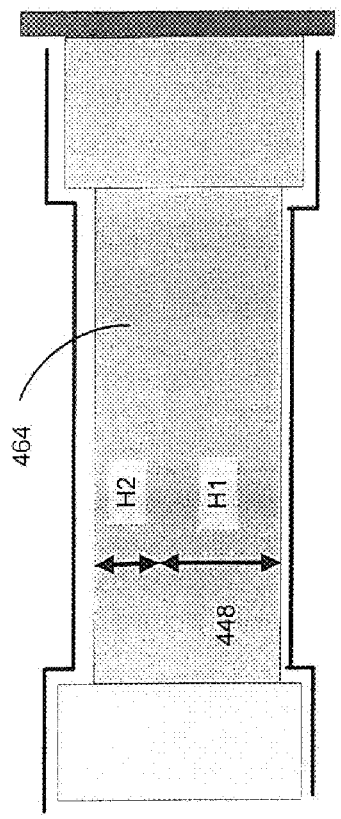
FIG. 4c
Conventional
Double Width AMC card/module
312

APPARATUS FOR ADAPTING MEZZANINE CARDS

CROSS REFERENCE TO RELATED APPLICATION

This application claims priority to U.S. provisional patent application having the Ser. No. 61/007,312 filed Dec. 11, 2007, incorporated herein in its entirety by reference.

FIELD OF THE INVENTION

The invention relates generally to an apparatus for adapting mezzanine cards and more particularly to a chassis or ATCA card design configured for use with both standard (AMC) and non-standard (AMC+) circuit cards.

DESCRIPTION OF THE RELATED ART

Modular systems are typically used in communication networks and avionic platforms where reliability and cost effectiveness are important factors. The modularity of the components in a modular system helps to reduce costs and improve reliability. A key component of a modular system is the modular platform. A modular platform includes, but is not limited to, backplanes that receive various types of circuit cards. These circuit cards may further include smaller circuit cards as front insertion Advanced Mezzanine Card (AMC) that provide additional functionality to the modular platform.

Typically, backplanes in modular platforms are designed to receive circuit cards that have a common design. This creates modularity by allowing circuit cards to be interchangeable in a modular platform. For example, circuit cards may be designed in compliance with the PCI Industrial Computer Manufacturers Group (PICMG), Advanced Telecommunications Computing Architecture (ATCA) Base Specification, PICMG 3.0 (hereinafter referred to as "the ATCA specification"). If circuit cards are designed to be compliant with the ATCA specification, the circuit cards will be interchangeable with other ATCA compliant circuit cards.

A, type of circuit card, commonly referred to as a "mezzanine carrier board," includes interfaces for additional Input/Output capability. One type of module to be attached to a mezzanine carrier board is a front accessible module. Similar to ATCA compliant circuit cards, a front accessible module's compliance with a specification may also result in interchangeability. One example specification is the AMC Specification, PIGMG AMC.0, (hereinafter referred to as "the AMC.0 specification"). PICMG specifications are available at (www.picmg.org).

The AMC relates to a wide-range of high-speed mezzanine cards. AMC can be plugged into an ATCA module or standalone module within a chassis. When plugged into an ATCA module the AMC is referred to as a mezzanine card. However when the AMC is used as a standalone module in a chassis it is no longer a mezzanine card, but instead it is the primary card that is in direct communication with the backplane.

AMC is designed to take advantage of the strengths of the PICMG 3.0 AdvancedTCA specification and the carrier grade needs of reliability, availability, and serviceability (RAS). The AMC module is designed to be hot swappable into an ATCA card or chassis.

The AMC faceplate are modular and will change depending upon the Input/Output (IO) required for the particular function. Module card guides support the insertion of the modules into the AMC connectors while the AMC bay provides mechanical support as well as Electromagnetic Interference (EMI) shielding. Connectivity between the AMC module and the carrier/chassis can be provided via an AMC connector that is attached to the carrier board or backplane. The AMC utilizes an edge finger connector whose mating connector is either on a carrier board or backplane.

One draw back with existing AMC is that it does not physically support the capability to host a PCI Mezzanine Card (PMC) or Switched Mezzanine Card (XMC) as a subassembly within a Single Module size form factor. The current solutions for this situation are to use an AMC Double Module size form factor which has enough room to accommodate one or more add on cards, (e.g., PMC. XMC). However, using a Double Module AMC imposes a number of drawbacks including non-optimal chassis design which include additional cooling requirements, reduced capability to meet harsh environments, decreased reliability, increased size and increased weight. Accordingly for these reasons as well as others this solution is expensive and not favored in the industry.

Therefore what is needed in the industry is a capability to host a PMC or XMC on an AMC that is much smaller than the Double Module AMC. This would be highly desirable to overcome the aforementioned drawbacks which collectively contribute to an optimized design of a chassis or blade configuration. Further, having such a capability would allow a designer to be able to take advantage of the large number of PMC and/or XMC modules that are presently available in the Commercial off the shelf (COTS) market in a minimum footprint. It is always preferred to maximize the use of common or COTS components whenever possible. Additionally, there exist a class of PMCs and XMCs, such as video capture and processors that are only suitable to a niche market and as a result are also not likely to be redesigned as AMC.

Accordingly the present invention described below and set forth in the claims is directed to an apparatus designed to overcome the aforementioned drawbacks of devices available on the market today.

SUMMARY OF THE INVENTION

The present disclosure provides a non-standard mechanically sized AMC module, referred to herein as an AMC+ module, and an apparatus for accommodating, both the AMC+ module as well as a standard AMC module. The apparatus of the present invention includes a modified card guide system which maybe implemented in a chassis or on an ATCA card.

The modified card guide system of the present invention generally comprises a lower card guide assembly and an upper card guide assembly. In one embodiment, the lower card guide assembly is fixed and the upper card assembly is adjustable. In another embodiment, the lower card guide assembly is adjustable and the upper card assembly is fixed. In yet another embodiment, both the lower card guide assembly and the upper card assembly are adjustable.

According to an aspect of the present invention, adjustable adaptors are provided for use within each card slot of a chassis to allow a user to readily adapt any chassis slot to be configured for use with an AMC standard card/module or an AMC+ card/module as needed.

An advantage of the invention includes the ability to accommodate both an AMC and AMC+ modules in a single chassis or ATCA blade using a novel card/module guide system. The novel card guide system allows users to utilize both standard AMC modules as well as a novel AMC+ module within the same chassis or ATCA card. An advantage of using the AMC+ module is that it provides a capability for hosting a large pre-existing inventory of legacy add-on cards/modules, such as, for example, pre-existing commercially available PMC and/or XMC cards/modules. The ability to allow users to incorporate a large pre-existing inventory of legacy add-on cards, such as PMC and XMC daughter cards, provides enhanced functionality at modest cost, given that such cards are readily available on the COTS market. At the same time, the novel card/module guide system of the present invention is advantageously backward compatible with the standard mechanically sized AMC modules. A further advantage provided by the present invention is that it becomes unnecessary to develop an AMC module to provide a function (s) which may already exist in a PMC or XMC form factor.

According to an aspect of the present invention, the novel card guide system design provides an environment suitable for a novel mezzanine card of the present invention that is non-standard only with respect to its mechanical configuration (e.g., width dimension). These cards are sometimes referred to herein as AMC+ cards. The non-standard AMC+ mezzanine card/module of the present invention may, in one embodiment, be constructed to be slightly larger in its width dimension than a standard AMC card/module. For example the width dimension may be slightly increased on the order of about 0.1 to about 0.8 inches, preferably about 0.3 to about 0.6 inches, and more preferably about 0.6 inches. Using a mezzanine card that is slightly larger than a standard single-width AMC card/module overcomes the prior art limitation of using double-width mezzanine cards as add-on card hosts.

The present invention is further described in the drawings and the detailed description following herewith.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION OF THE INVENTION

Figure 1:
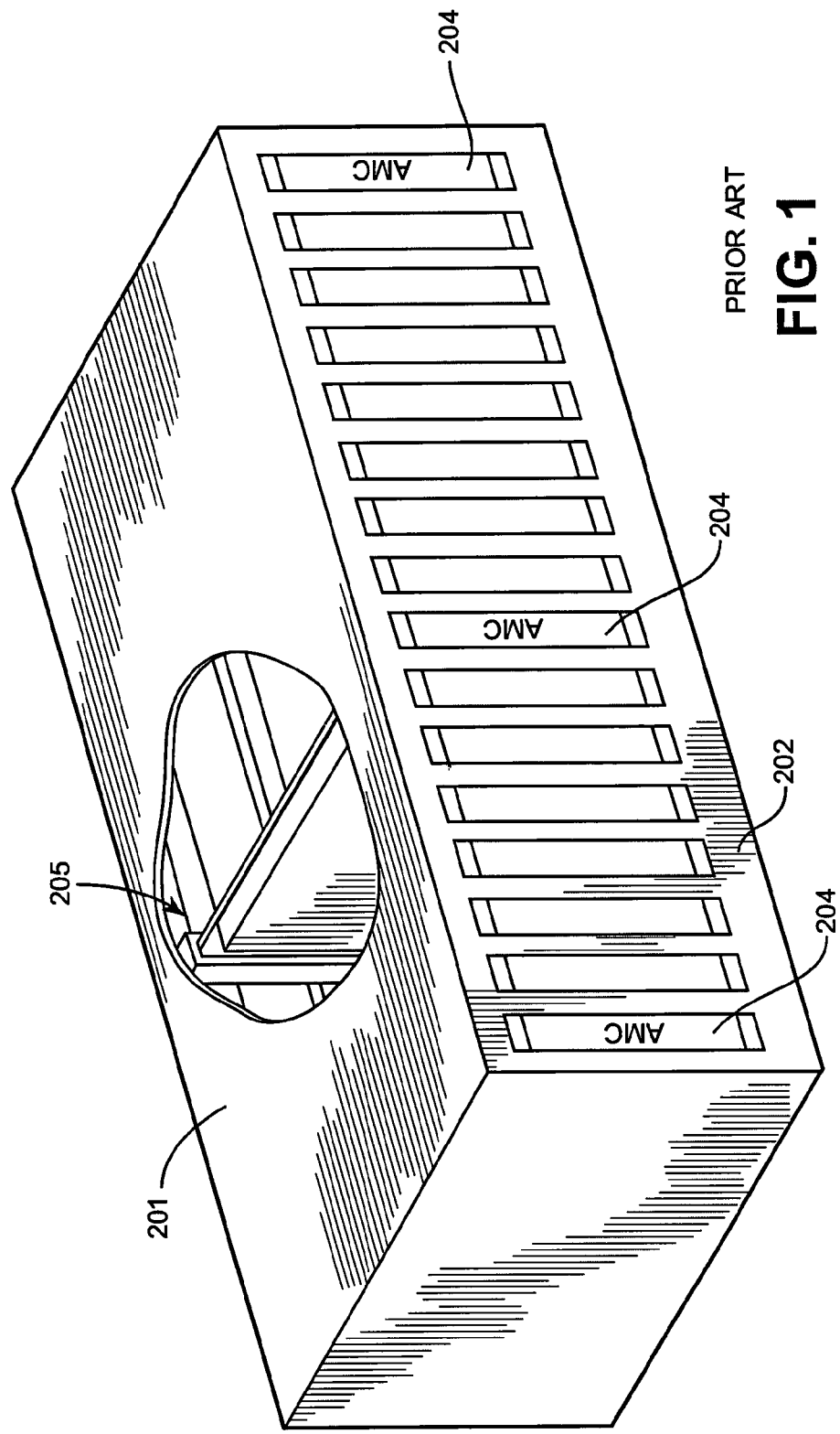
FIG. 1 representatively illustrates a prior art MicroTCA subrack.

In the following description, numerous specific details are set forth, such as implementations for Advanced Mezzanine Card (AMC) cards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention overcomes the limitation of not being able to utilize a large pre-existing inventory of legacy products, such as PMC and XMC cards/modules, without resorting to use a standard double width AMC card/module as a host or otherwise having to design an AMC card module, either in a single or double width AMC form factor, to accommodate the functionality that presently exists within the presently available XMC or PMC form factor.

Accordingly, the present invention contemplates the use of a modified AMC card/module, sometimes referred to herein as an AMC+ card/module. The AMC+ card module may be characterized in that at least one dimension is slightly increased above that of a standard single width AMC card/module, which are well known in the art. It is recognized by the present invention that this increased dimension is sufficient to accommodate the large pre-existing inventory of legacy products.

As will be described further below, the novel AMC+ card/modules are used together with a novel optimized card guide system of the invention. The novel card guide system is flexibly suitable for use with both standard AMC card/modules and the novel AMC+ card/modules of the invention, while maintaining compliance with the AMC.0 specification, which includes features such as hot swapping, for example. Further details of the AMC.0 specification may be readily obtained from www.PICMG.org, incorporated in its entirety herein by reference.

While examples of the novel non-standard AMC+ card/module of the present invention are illustrated throughout the figures, it should be understood that the AMC+ card/module is described herein for purposes of illustration and explanation only. It is understood that embodiments of the present invention are generally applicable to any insertable card/module that is non-standard in at least one dimension, such as optical card/modules, transceiver card/modules, and the like.

The present invention is further described in connection with FIGS. 1 through 5 and their description set forth below.

FIG. 1 representatively illustrates a prior art MicroTCA subrack 201. The MicroTCA chassis 201 is an example of a typical subrack utilized in industry to provide a reference to which the present invention is to be compared. Details on MicroTCA subrack design and configurations can be found in PICMG™ MicroTCA.0.

The prior art MicroTCA system is a collection of interconnected elements including at least one AMC module 204 and the interconnect, MicroTCA carrier hub, power, cooling and mechanical resources need to support them.

A typical prior art MicroTCA system, such as the one shown in FIG. 1, may consist of plurality of AMC modules 204, 14 of which are shown by way of example, coupled to a subrack 205, and a chassis 201.

With continued reference to FIG. 1, the single width standard AMC modules 204 shown are suitable for use with the MicroTCA chassis 201 of FIG. 1. These AMC modules 204 typically have dimensions of a standard size AMC module. It is noted that a drawback of the prior art MicroTCA chassis 201 is that there are no provisions in the chassis 201 or subrack 205 for accommodating AMC modules other than those of the single width or double width standard form factor sizes. The present invention overcomes this limitation as will be described below.

Figure 2:
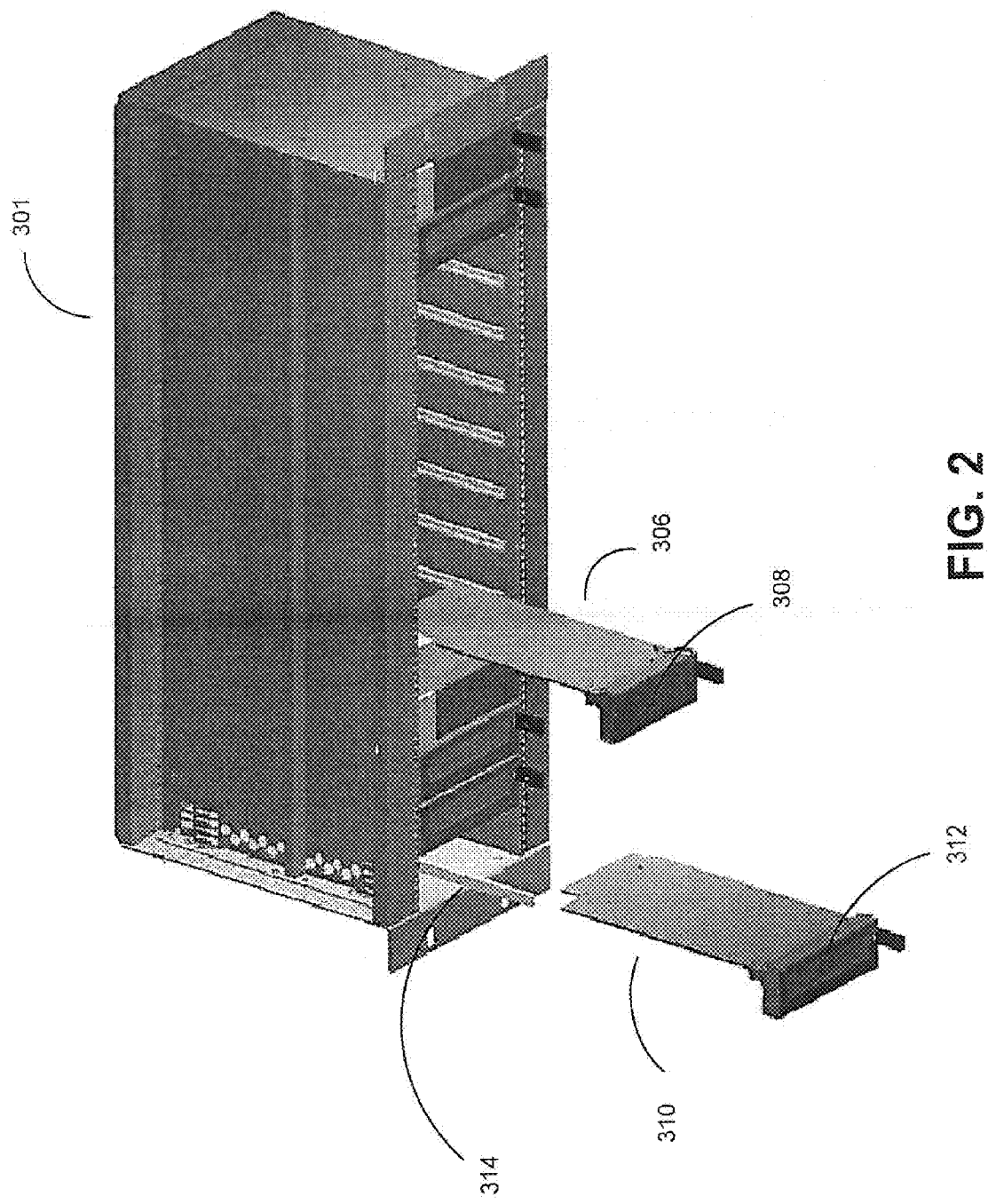
FIG. 2 is a top plan view of a MicroTCA subrack in accordance with an embodiment of the invention.

FIG. 2 representatively illustrates a MicroTCA chassis 301 in accordance with an exemplary embodiment of the present invention. For the purpose of simplicity and clarity, other components including cooling fans and ducting are not shown in FIG. 2. A novel card guide system of the MicroTCA chassis 301 includes a plurality of adjustable card guides 314, one of which is shown by way of example, to accommodate the insertion of the novel AMC+ card/modules 310 of the invention into any of the available chassis slots. FIG. 2 illustrates a single AMC+ card 310 shown in exploded view. The AMC+ card 310 is suitable for insertion into the corresponding chassis slot by utilizing adjustable card guide 314.

A key feature of the invention is that the MicroTCA chassis 301 also accommodates standard AMC cards, such as AMC card 306, shown in exploded view in FIG. 2. Given that the AMC card/modules 360 are of a standard mechanical configuration, when they are inserted into the MicroTCA chassis 301 they do not require the assistance of adjustable card guide 314 to accommodate their insertion.

As described above, the MicroTCA chassis 301 flexibly accommodates both the standard AMC card/modules 306 and the novel AMC+ card/modules 310 of the invention. Advantages of flexibly accommodating both types of cards are described above.

It should be understood that the exemplary MicroTCA chassis 301, as shown in FIG. 2, is not limited to being a MicroTCA chassis for hosting standard 306 and non-standard 310 mezzanine card/modules. In other embodiments, the invention contemplates the use of chassis and insertable cards/modules that comply with and/or are compatible with various technical specifications in addition to, or in the alternative to, the AMC Specification. For example the card/modules may be embodied as standard and non-standard sized PC cards, common mezzanine cards, and the like. In other words, the scope of the present disclosure should not be construed as being limited to any particular module or card form factor.

Figure 3:
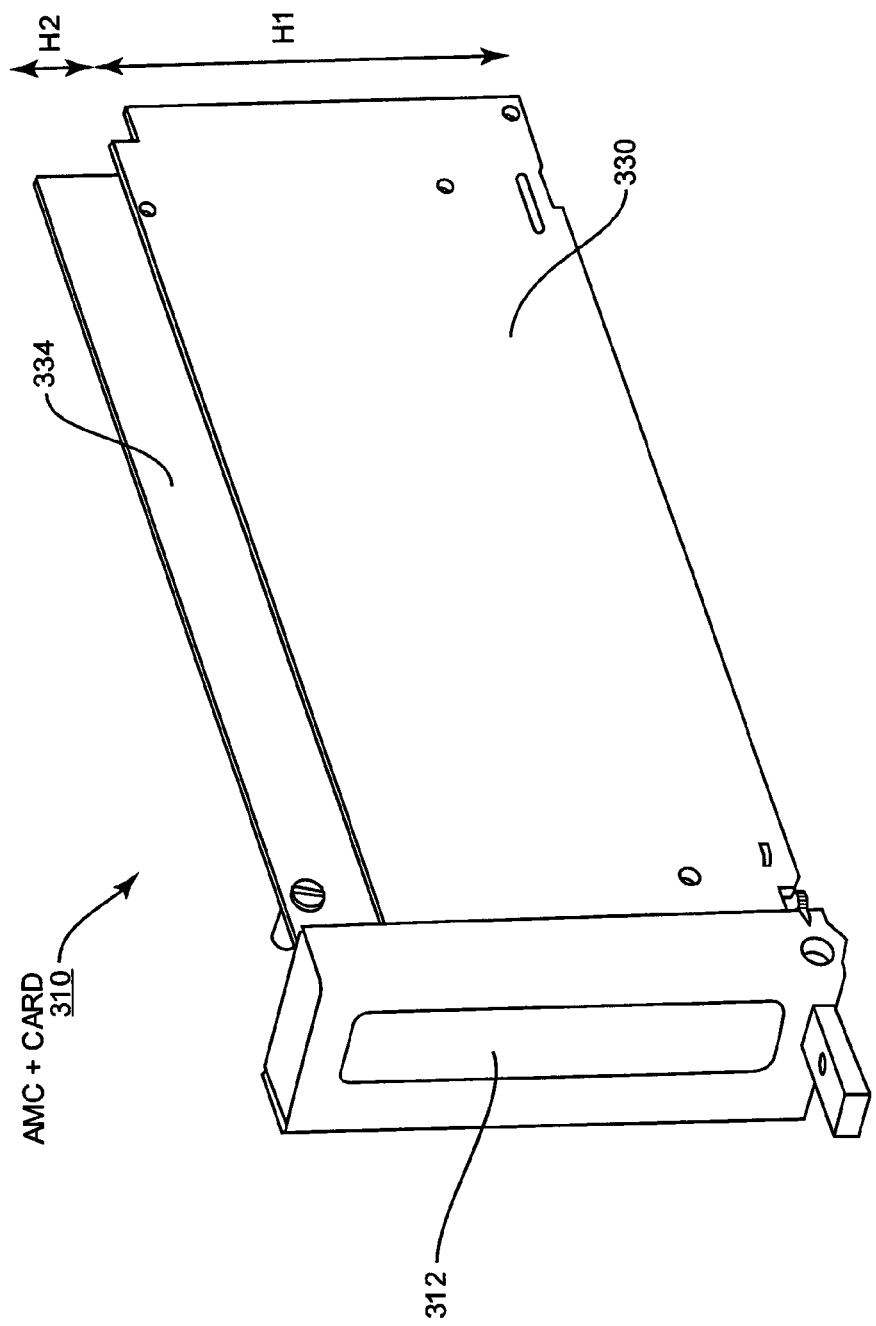
FIG. 3 illustrates a perspective view of one exemplary embodiment of an AMC+ 310 as shown in FIG. 2.

FIG. 3 illustrates a perspective view of one exemplary embodiment of an AMC+ 310 as shown in FIG. 2. In the illustrated example, the AMC+ module 310 is comprised of a modified faceplate 312 coupled to a novel AMC+ printed wiring board (pwb) 330. The printed wiring board 330 is further comprised of a first portion 332 and a second portion 334. The first portion 332 represents a conventional single width pwb area as defined in AMC.0 having a width H1. The second portion 334 of pwb 330 represents an increased pwb area having a width H2. The width H2 represents an increased single physical dimension which differentiates the novel AMC+ card/module 310 of the invention from the standard AMC card/modules 306 of the prior art.

It is noted that the increased area provided by second portion 334 maintains the module depth as specified in AMC.0 while increasing the dimension which governs the width of the AMC module as indicated by the increased width H2. It should be appreciated that the novel AMC+ card/module 310, as modified in its width dimension, maintains full compliance to the AMC.0 specification.

FIG. 4a illustrates a standard single width AMC card/module 310 comprised of a module printed circuit board (PCB) 440 coupled to a module front plate 442. The AMC card/module 310 may be inserted into a backplane connector 444 via an AMC connector 446. Card guides 448 guide the AMC card/module 310 for insertion into the backplane connector 444. The AMC card/module 310 PCB 440 is shown to have a width dimension, generally designated as H1, where H1=73.8 mm=2.91 inches.

FIG. 4c illustrates a conventional double width AMC card/module 312 comprised of the same components described above. However, the double width AMC card/module 312 PCB 464 has a width dimension of H2=148.8 mm=5.86 inches.

Figure 4B:
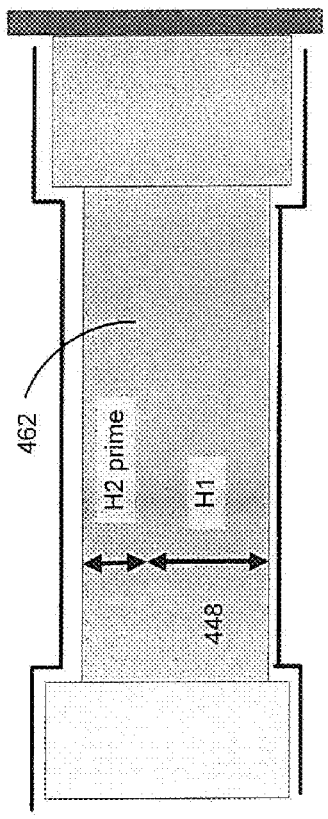
FIG. 4 is a perspective view illustrating an AMC+ module as one example of a module that may be utilized within the chassis according to embodiments of the present invention.

FIG. 4b illustrates an AMC+ card/module 306 of the present invention comprised of the same components described above, however, the AMC+ card/module 306 PCB 462 has an increased width dimension of $H2_{prime}$, which is greater than the conventional single width AMC card module 310, i.e., designated as H1, and less than the conventional double width AMC card, designated as (H1+H2). Therefore, the width of the PCB 462 of the AMC+ card/module 306, $W_{AMC+}$, is in the range:

$$H1 > W_{AMC+} < (H1+H2)$$

Accordingly, the increased width of the AMC+ card/module 310 over a conventional single width AMC card/module 306 is less than H2=75 mm, where $$H2 = \text{width of double width } AMC \text{ card} - \text{width of single width}$$
$$ACM \text{ card}$$
$$= 148.8 \text{ mm} - 73.8 \text{ mm}$$
$$= 75 \text{ mm}$$

By way of example and not limitation, the novel AMC+ card/module 310 shown in FIG. 4b has a total width dimension $W_{AMC+}=(H1+H2_{prime})$ which, in a preferred embodiment, is on the order of about 0.6 inches larger than the width H1 of the well-known standard single length AMC card module 306, i.e., (H2=0.6). In other preferred embodiments, the AMC+ module 310 is about 0.3 to about 0.6 inches larger than the well-known standard single length AMC card module 306. It should be understood, however, that in general, the novel AMC+ card/module 310 of the present invention can have any increased width dimension that is greater than the width of a single length AMC card module 306, i.e., 73.8 mm and less than the width of a double length AMC card module, i.e., 148.8 mm.

Figure 5:
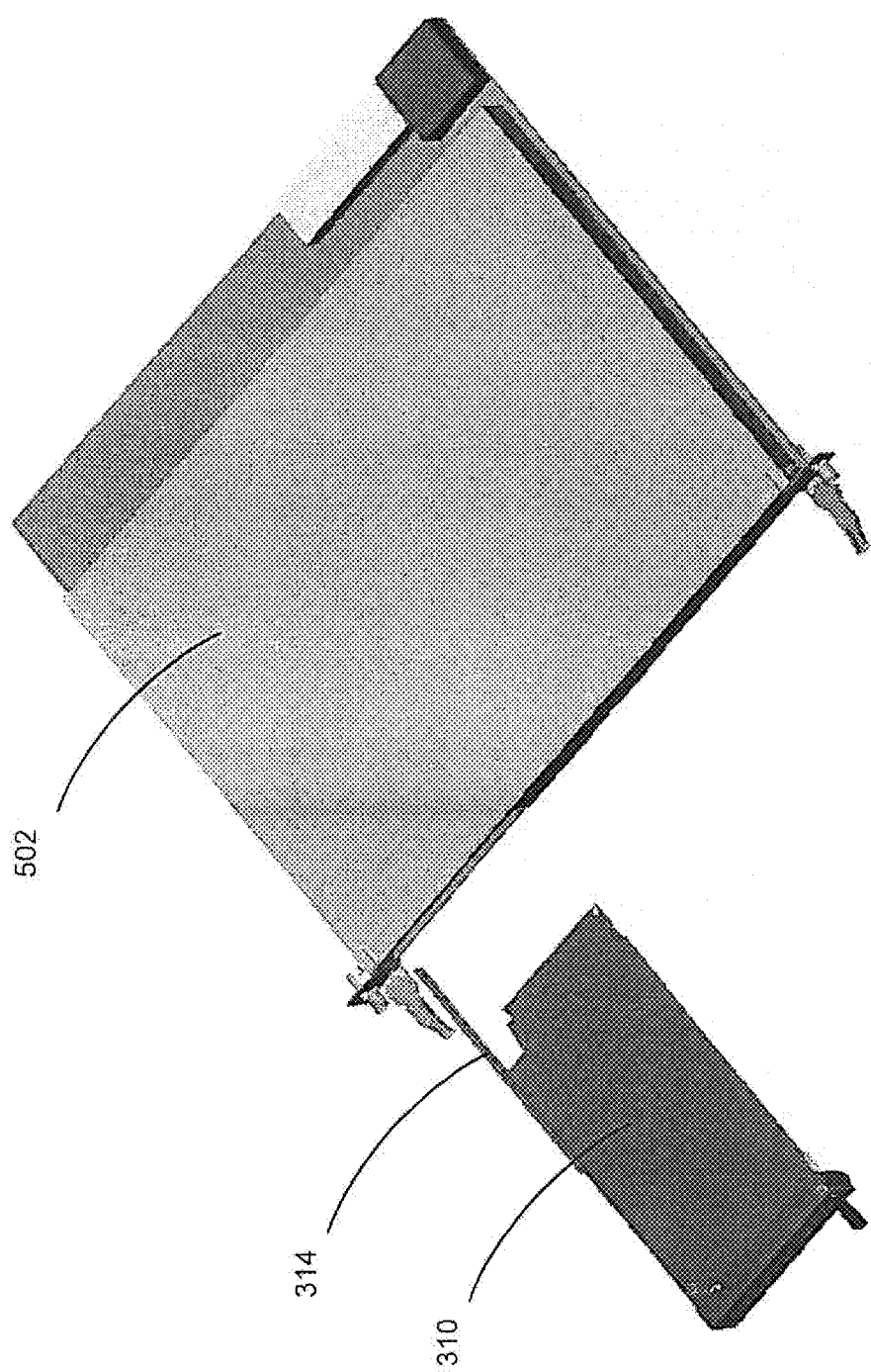
FIG. 5 is a perspective view illustrating an AMC+ module as one example of a module that may be utilized within an ATCA blade according to embodiments of the present invention.

FIG. 5 representatively illustrates a ATCA card design configured for use with both standard (AMC) and non-standard (AMC+) circuit cards, in accordance with an exemplary embodiment of the present invention. For the purpose of simplicity and clarity, other components of the ATCA card design are not shown in FIG. 5. A novel card guide system of the ATCA card 502 includes one or more adjustable card guides 314, one of which is shown by way of example, to accommodate the insertion of the novel AMC+ card/modules 310 of the invention into a slot of the ATCA card 502. FIG. 5 illustrates a single AMC+ card 310 shown in exploded view. The AMC+ card 310 is suitable for insertion into the ATCA slot by utilizing adjustable card guide 314.

Figure 6:
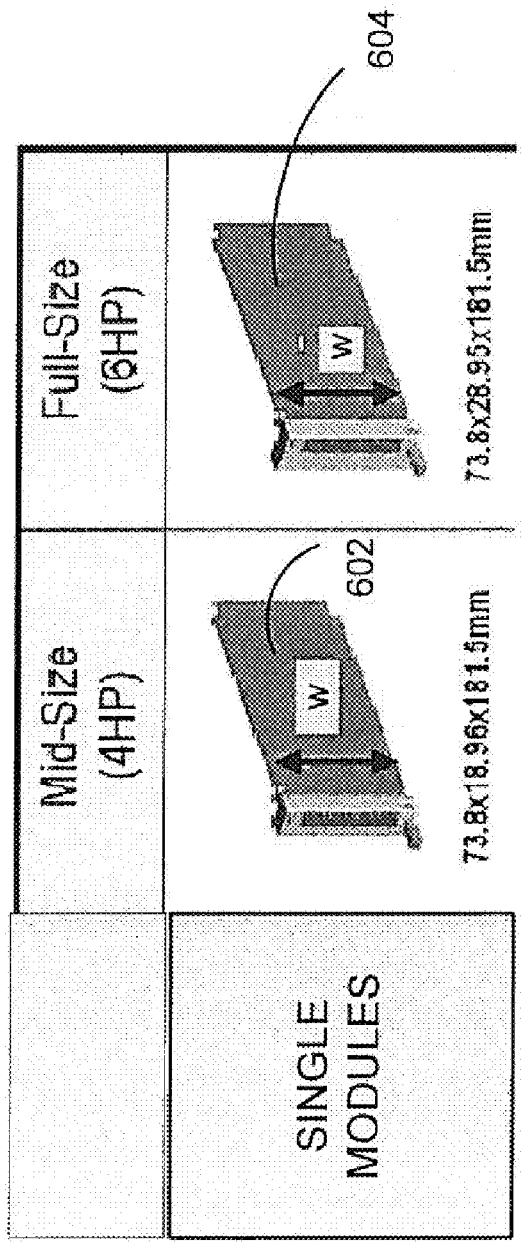
FIG. 6 illustrates a number of AMC module configurations suitable for use with the present invention.

FIG. 6 illustrates a number of AMC module configurations suitable for use with the present invention in accordance with the previously described dimensional modifications. The exemplary module configurations suitable for modification in a single dimension include, but are not limited to, single modules of various sizes including a Mid-Size single module 602 and a Full-Size single module 604. Each of the aforementioned module configurations is preferably modified in a single dimension, such as the module's width "w".

The foregoing is to be construed as only being an illustrative embodiment of this invention. Persons skilled in the art can easily conceive of alternative arrangements providing a functionality similar to this embodiment without any deviation from the fundamental principles or the scope of the invention.

What is claimed is:

1. An apparatus for accommodating at least two different sized cards each having a different card height, the apparatus comprising:
 a card housing comprising at least one card slot having a card slot height, said card slot configurable to support a card on opposing sides thereof and being adaptable for inserting either of said at least two different sized cards, the at least two different sized cards comprising a first sized card being an Advanced Mezzanine Card (AMC) module and a second sized card being an Advanced Mezzanine Card plus (AMC+) module, said AMC+ module suitable for hosting on said AMC+ module a PCI Mezzanine Card (PMC) module and a Switched Mezzanine Card (XMC) module and having a modified faceplate to accept a front panel of the PMC module or the XMC module, wherein a height of the AMC+ module is greater than the height of the AMC module and said width of said AMC+ module is less than a width of a double AMC module and greater than a width of a single AMC module; and
 an adjustable card guide system for adapting said at least one card slot for insertion of one of the AMC module and AMC+ module, said adjustable card guide system including a card guide mounting plate positioned along a length of a location configured to receive a length of an inserted AMC module or AMC+ module that increases a height of the at least one card slot, a first card guide connectable to said card guide mounting plate along the length of the location configured to receive the length of an inserted AMC module or AMC+ module, said first card guide configured to conform the height of the AMC module to the height of the at least one card slot, and a second card guide connectable to said card guide mounting plate along the length of the location configured to receive the length of an inserted AMC module or AMC+ module, said second card guide configured to conform the height of the AMC+ module to the height of the at least one card slot.

2. An apparatus according to claim 1, wherein the card housing is a chassis.

3. An apparatus according to claim 1, wherein the housing is a blade.

4. An apparatus according to claim 1, wherein the adjustable card guide system includes a plurality of card guide mounting plates and a plurality of card guides.

5. An apparatus according to claim 1, wherein the adjustable card guide system is insertable in a top card guide area of a card slot of the card housing.

6. An apparatus according to claim 1, wherein the adjustable card guide system is insertable in a bottom card guide area of a card slot of the card housing.

7. An apparatus according to claim 1, wherein the at least two different sized cards are hot swappable in card slots of the card housing.

8. An apparatus according to claim 2, wherein the chassis is a MicroTCA chassis.

9. An apparatus according to claim 3, wherein the blade is an ATCA blade.

10. An apparatus according to claim 4, wherein the adjustable card guide system is insertable in one of a top card and a bottom card guide area of a card slot of the card housing.

11. A modified mezzanine card having an increased width dimension relative to a standard mezzanine card, said modified mezzanine card insertable in an apparatus for accommodating the modified mezzanine card and the standard mezzanine card, the apparatus comprising:
 a card housing comprising at least one card slot having a card slot width, said card slot configurable to support either of the modified mezzanine card and the standard mezzanine card on opposing sides thereof and being adaptable for inserting either of the modified mezzanine card and the standard mezzanine card, the standard mezzanine card being an Advanced Mezzanine Card (AMC) module and the modified mezzanine card being an Advanced Mezzanine Card plus (AMC+) module, said AMC+ module suitable for hosting on said AMC+ module a PCI Mezzanine Card (PMC) module and a Switched Mezzanine Card (XMC) module and having a modified faceplate to accept a front panel of the PMC module or the XMC module, wherein a height of the AMC+ module is greater than the height of the AMC module and said width of said AMC+ module is less than a width of a double AMC module and greater than a width of a single AMC module; and
 an adjustable card guide system for adapting said at least one card slot for insertion of one of the AMC module and AMC+ module, said adjustable card guide system including a card guide mounting plate positioned along a length of a location configured to receive a length of an inserted AMC module or AMC+ module that increases a height of the at least one card slot, a first card guide connectable to said card guide mounting plate along the length of the location configured to receive the length of an inserted AMC module or AMC+ module, said first card guide configured to conform the height of the AMC module to the height of the at least one card slot, and a second card guide connectable to said card guide mounting plate along the length of the location configured to receive the length of an inserted AMC module or AMC+ module, said second card guide configured to conform the height of the AMC+ module to the height of the at least one card slot.

12. A modified mezzanine card according to claim 11, wherein the non-standard height dimension is on the order of about 0.1 to 0.8 inches greater than the standard height dimension of a standard mezzanine card.

13. A modified mezzanine card according to claim 11, wherein the non-standard mezzanine card is a mid-size single module mezzanine card.

14. A modified mezzanine card according to claim 11, wherein the modified mezzanine card is a full-size single module mezzanine card.

15. A modified mezzanine card according to claim 11, comprises a modified faceplate coupled to a non-standard sized printed wiring board.

16. A modified mezzanine card according to claim 12, wherein the non-standard height dimension is preferably between about 0.3 to 0.6 inches greater than the standard height dimension of a standard mezzanine card.

17. A modified mezzanine card according to claim 16, wherein the non-standard height dimension is preferably about 0.6 inches greater than the standard height dimension of a standard mezzanine card.

* * * * *